(12) United States Patent
Zhu et al.

(10) Patent No.: US 9,467,162 B1
(45) Date of Patent: Oct. 11, 2016

(54) SWITCHED CAPACITOR DIGITAL-TO-ANALOG CONVERTER

(71) Applicant: Amlogic Co., Ltd., Santa Clara, CA (US)

(72) Inventors: Hao Zhu, San Jose, CA (US); Kai Fan, Shanghai (CN); Xiaoniu Luo, Shanghai (CN); Chieh-Yuan Chao, Fremont, CA (US)

(73) Assignee: Amlogic Co., Limited, Santa Clara, CA (US)

( * ) Notice: Subject to any disclaimer, the term of this patent is extended or adjusted under 35 U.S.C. 154(b) by 0 days.

(21) Appl. No.: 14/805,376

(22) Filed: Jul. 21, 2015

(51) Int. Cl.
*H03M 1/66* (2006.01)
*H03M 1/80* (2006.01)
*H03M 1/08* (2006.01)

(52) U.S. Cl.
CPC .......... *H03M 1/802* (2013.01); *H03M 1/0854* (2013.01)

(58) Field of Classification Search
CPC ....... H03M 1/80; H03M 1/802; H03M 1/804
USPC .................................................. 341/150, 144
See application file for complete search history.

(56) References Cited

U.S. PATENT DOCUMENTS

| | | | | |
|---|---|---|---|---|
| 6,486,812 B1* | 11/2002 | Tanaka | ............. | H03M 1/68 341/144 |
| 6,606,045 B2* | 8/2003 | Azami | ............. | G09G 3/3275 341/144 |
| 7,423,558 B2* | 9/2008 | Ueno | ............. | H03M 1/0697 341/144 |
| 7,786,917 B2* | 8/2010 | Hu | ............. | H03M 1/68 341/150 |
| 7,796,074 B2* | 9/2010 | Walton | ............. | H03M 1/664 341/144 |
| 8,537,045 B2* | 9/2013 | Kapusta | ............. | 341/144 |

* cited by examiner

*Primary Examiner* — Khai M Nguyen
(74) *Attorney, Agent, or Firm* — Venture Pacific Law, PC

(57) ABSTRACT

A switched capacitor digital-to-analog converter ("DAC") for converting a digital input code to an analog signal comprises a switched capacitor array and a reset switch having a first end and a second end. The digital input code is inputted to the switched capacitor array. The switched capacitor array is connected to a summation node. The first end of the reset switch is connected to the summation node and the second end of the reset switch is connected to a common mode voltage. The reset switch is closed after a plurality of sampling cycles. The analog signal is provided based on a summation voltage at the summation node.

19 Claims, 7 Drawing Sheets

SWITCHED CAPACITOR DIGITAL-TO-ANALOG CONVERTER

FIELD OF INVENTION

The disclosure relates to a digital-to-analog converter ("DAC"), and, more particularly, to a switched capacitor DAC having a reset mechanism.

BACKGROUND

A digital-to-analog converter ("DAC") is a device that generates an analog signal from an inputted digital signal. The DAC can be used in a variety of applications including data communications (including voice, video, etc.), measurement and testing devices, and data telemetry devices. Analog signals are continuous time-domain signals with infinite resolution. However, the DAC's output is a signal constructed from discrete values (or quantization) generated at uniform, but finite, time intervals (referred to as sampling). In other words, the DAC output attempts to represent an analog signal with one that features finite resolution and bandwidth.

Quantization and sampling impose fundamental limits on DAC performance. Quantization determines the maximum dynamic range of the converter and results in quantization error or noise in the output. Sampling determines the maximum bandwidth of the DAC output signal according to Nyquist criteria. The DAC operation is affected by non-ideal effects beyond those dictated by quantization and sampling. These errors are characterized by a number of performance specifications that determine the converter's static and dynamic performance.

In particular for a switched capacitor DAC, a non-ideal switch can lead to voltage drift of a bottom plate of a quantization cap of a switched capacitor DAC. In order to combat the voltage drift, a return-to-zero ("RZ") scheme was implemented having a reset operation to occupy some of the conversion time to reset the digital output to a common mode voltage Vcm after each sampling. However, this doubles the transition numbers, limiting the max operation of the switched capacitor in an RZ scheme compared to a non-RZ ("NRZ") scheme for a DAC.

FIG. 1a illustrates a non-return-to-zero impulse response for a switched capacitor DAC. The impulse response of a NRZ scheme shows that an envelope of the sampled digital input code is taken for an entire sampling cycle Ts. FIG. 1b illustrates a return-to-zero impulse response for a switched capacitor DAC. The impulse response of a RZ scheme shows that the envelope of the sampled digital input code only takes a part of the sampling cycle Ts since part of the sampling cycle is needed for the return to zero portion. Thereby, the RZ scheme is not as efficient as the NRZ scheme.

Although the RZ scheme is effective in preventing deviation of the DAC from the common mode voltage, it is desirable to provide new methods, apparatuses, and systems for preventing the deviation from the common mode voltage while minimizing the effect on the conversion time of the DAC.

SUMMARY OF INVENTION

Briefly, the disclosure relates to a switched capacitor digital-to-analog converter ("DAC") for converting a digital input code to an analog signal, comprising: a switched capacitor array, wherein the digital input code is inputted to the switched capacitor array and wherein the switched capacitor array is connected to a summation node; and a reset switch having a first end and a second end, wherein the first end is connected to the summation node and the second end is connected to a common mode voltage, wherein the reset switch is closed after a plurality of sampling cycles, and wherein the analog signal is provided based on a summation voltage at the summation node.

DESCRIPTION OF THE DRAWINGS

The foregoing and other aspects of the disclosure can be better understood from the following detailed description of the embodiments when taken in conjunction with the accompanying drawings.

DETAILED DESCRIPTION OF THE EMBODIMENTS

In the following detailed description of the embodiments, reference is made to the accompanying drawings, which form a part hereof, and in which is shown by way of illustration of specific embodiments in which the disclosure may be practiced.

Figure 1B:
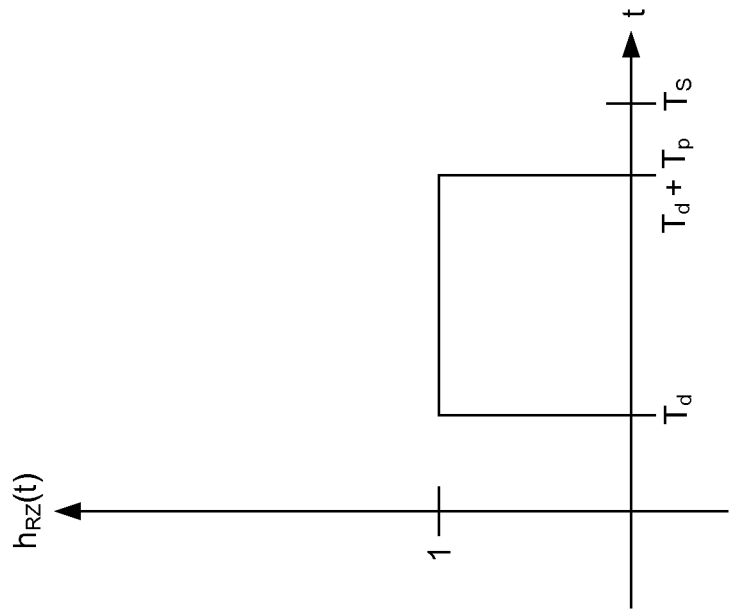
FIG. 1b illustrates a return-to-zero impulse response for a switched capacitor DAC.
Figure 1A:
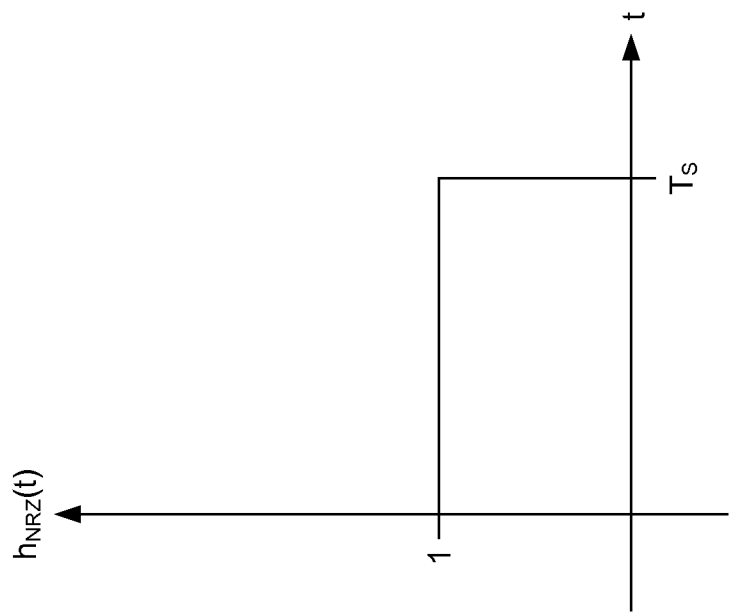
FIG. 1a illustrates a non-return-to-zero impulse response for a switched capacitor DAC.
Figure 2:
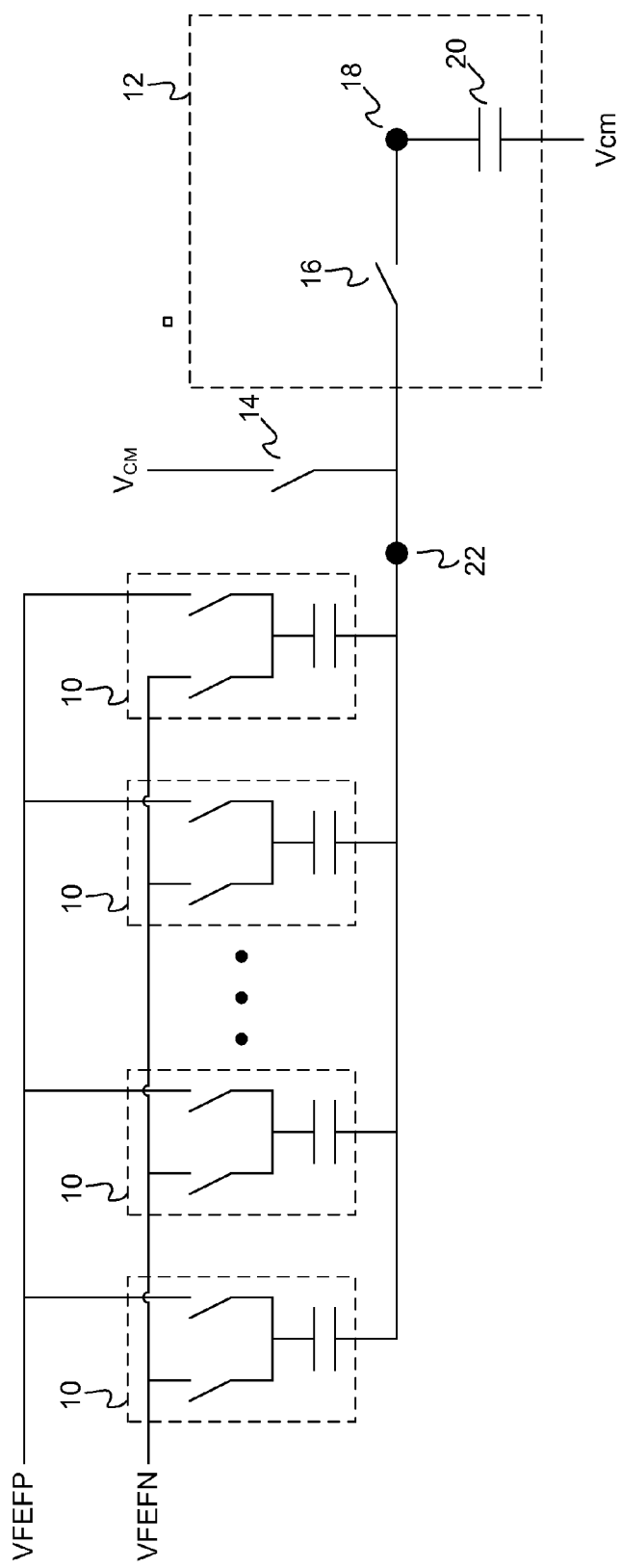
FIG. 2 illustrates a switched capacitor DAC of the present disclosure.

FIG. 2 illustrates a switched capacitor DAC of the present disclosure. A switched capacitor digital-to-analog converter ("DAC") for converting a digital input code to an analog signal comprises a switched capacitor array of switched capacitor elements 10, a reset switch 14, and an isolation block 12. The DAC can be referred to as a single DAC having switched capacitors. The switched capacitor elements 10 are connected in an array having a first end connected to a summation node 22, a second end connected to a first reference signal VFEFN and a third end connected to a second reference signal VFEFP. Each of the switched capacitor elements 10 has two switches and a capacitor connected together at one end, where the other end of the capacitor is connected to the summation node 22. The other end of one of the switches is connected to the second reference signal VFEFP; and the other end of the second one of the switches is connected to the first reference signal VFEFN.

The second reference signal VFEFP and the first reference signal VFEFN are reference voltages used to determine the voltage level of the digital input code of the DAC. If the second reference signal VFEFP is high, then the first reference signal VFEFN is low and vice versa. The output voltage signal VX of the switched capacitor DAC can be sensed at the summation node 22.

The digital input code is decoded into control signals SP<0> to SP<N> and SN<0> to SN<N> for the switches of the switched capacitor elements 10. A corresponding pair for each of the control signals is inputted to one of the switched capacitor elements 10. For instance, the control signal SP<0> controls the operation of the switch of a first switched capacitor element connected to the second reference signal VFEFP; the control signal SN<0> controls the operation of the other switch of the first switched capacitor element connected to the first reference signal VFEFN. The control signal SP<1> controls the operation of the switch of a second switched capacitor element connected to the second reference signal VFEFP; the control signal SN<1> controls the operation of the other switch of the second switched capacitor element connected to the first reference signal VFEFN. Likewise for every pair of control signals SP<N> and SN<N>, there is a corresponding switched capacitor element to control.

The reset switch 14 resets the summation voltage VX to a common mode voltage for a predefined amount of time after a preset number of sampling cycles of the DAC. The preset number of sampling cycles can be designed for a certain plurality of sampling cycles or randomly selected such that the number is greater than one. When the reset switch 14 is closed, the summation voltage VX at the summation node 22 is brought to the common mode voltage Vcm. Typically, the common mode voltage can be at a constant voltage level between the voltages VFEFP and VFEFN.

The isolation block 12 is connected to the summation node 22 to maintain the output voltage at a certain level when the reset switch 14 is activated. In this manner, the summation voltage will have a slight drop in its output waveform. In an example embodiment, the isolation block 12 comprises an isolation switch 16 and a capacitor 20. The isolation switch 16 and the capacitor 20 are connected across the summation voltage VX at the summation node 22 and the common mode voltage Vcm. A node 18 between the connection of the isolation switch 16 and the capacitor 20 can be used for sensing the voltage at this connection. When the reset switch 14 is opened, the isolation switch 16 is closed, so the conversion results of the summation node 22 can be shorted to the node 18. When the reset switch 14 is closed, then the isolation switch 16 is opened, and the left side from the isolation switch 16 at the summation node 22 can be reset, while the right side of the isolation switch 16, at the node 18, will not be impacted.

The switched capacitor DAC of the present disclosure can have a conversion state for actively converting the digital input code to the analog signal and an idle state for the DAC to be idle. During the conversion state and/or idle state, the reset switch can be closed and then opened after a predefined number of sampling cycles to reset the summation node to the common mode voltage. The predefined number of sampling cycles can be randomly changed to a different number for the next reset operation. During reset, the reset switch can be closed for only a portion of a sampling cycle to improve the operating speed of the DAC.

In certain embodiments, the reset switch is closed only when the summation voltage at the summation node is within a predefined threshold from a common mode voltage. Furthermore, the condition for closing the reset switch can be extended to include the condition when the summation voltage is within the predefined voltage thresholds for a predefined amount of time. If the summation voltage is not within the voltage thresholds for the predefined amount of time, then the reset function may not be activated until time when the summation voltage is in that voltage thresholds from the predefined amount of time.

Figure 3:
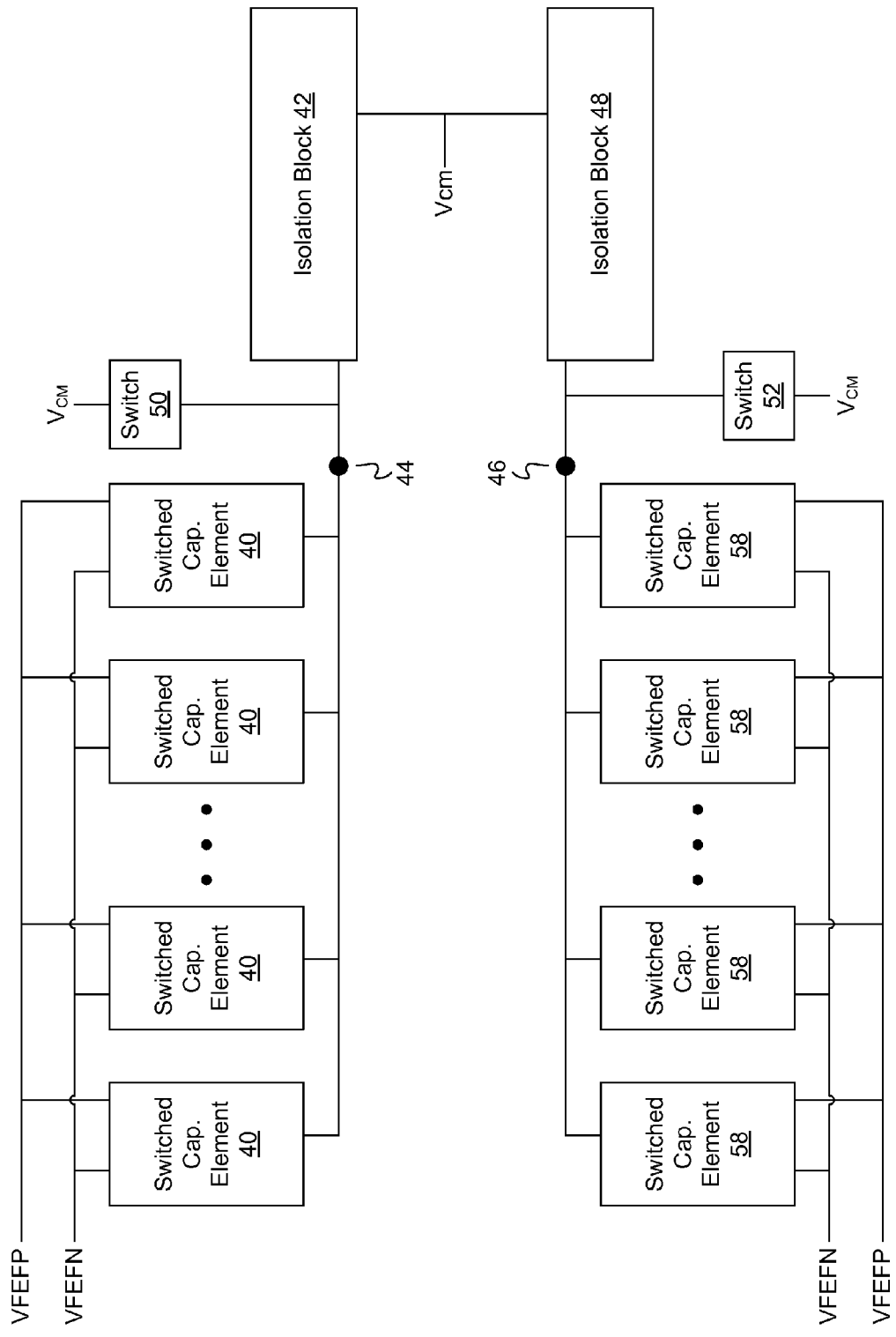
FIG. 3 illustrates a full differential switched capacitor DAC of the present disclosure.

FIG. 3 illustrates a full differential switched capacitor DAC of the present disclosure. A full differential DAC of the present disclosure comprises arrays of switched capacitor elements 40 and 58, reset switches 50 and 52, and isolation blocks 42 and 48. A differential DAC may have differential digital codes inputted to the differential DAC such that each of the differential digital codes may need to be separately processed into differential analog signals. For that purpose, the full differential DAC may comprise two single DACs, as illustrated herein.

In particular, the array of switched capacitor elements 40, the reset switch 50, and the isolation block 42 are connected in the same manner as a single DAC. A positive digital input code can be inputted to the switches of the switched capacitor elements 40 to provide for a positive summation output at a summation node 44.

Similarly, the array of switched capacitor elements 58, the reset switch 52, and the isolation block 48 are connected in the same manner as a single DAC. A negative digital input code can be inputted to the switches of the switched capacitor elements 58 to provide for a negative summation output at a summation node 46. The positive summation output and the negative summation output can be used to generate the DAC's output of the differential analog signals. For instance, a smoothing filter can be applied to the summation outputs of the DAC to form the differential analog signals.

Figure 4:
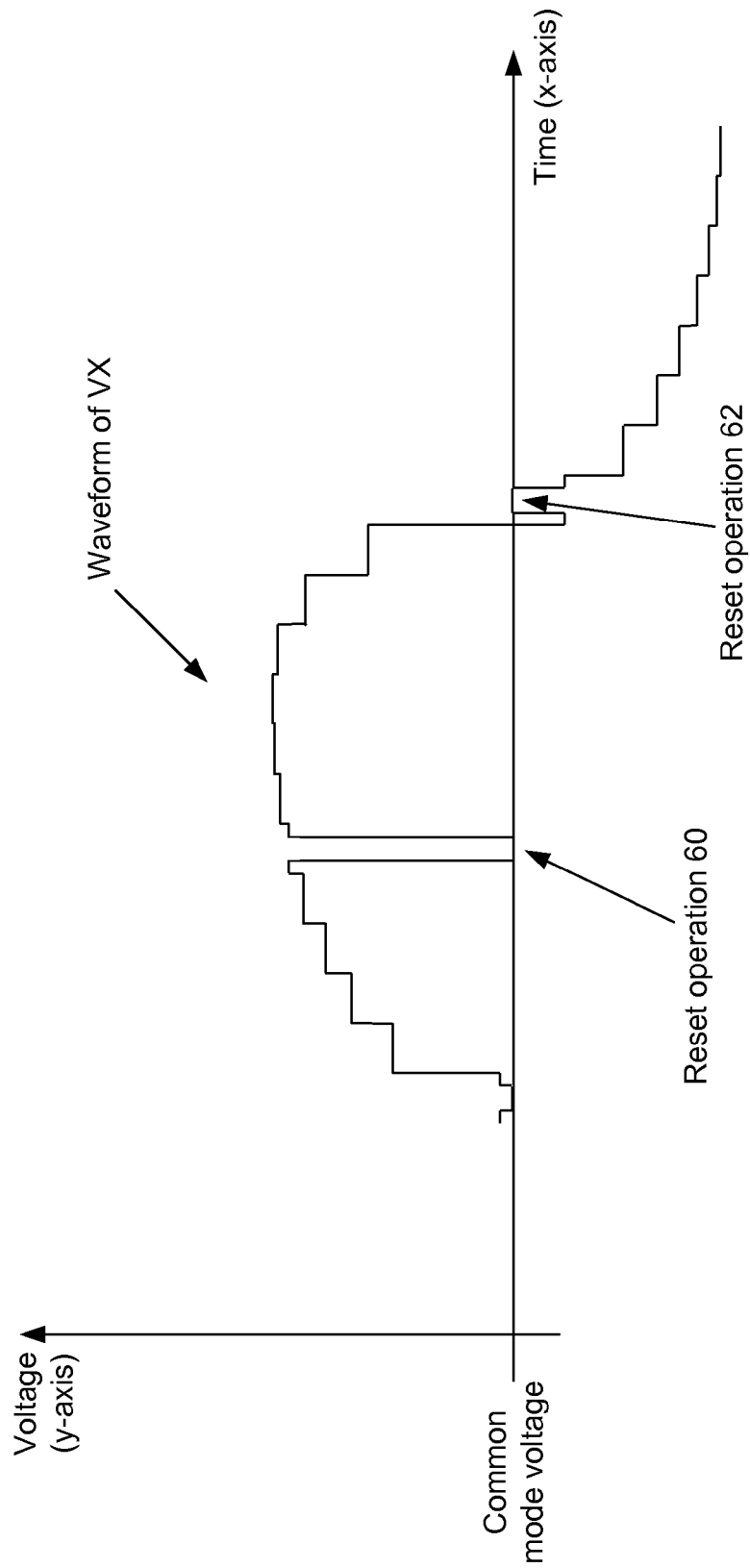
FIG. 4 illustrates a waveform for a switched capacitor DAC of the present disclosure.

FIG. 4 illustrates a waveform for a switched capacitor DAC of the present disclosure. A single switched capacitor DAC of the present disclosure can have a reset mechanism to reset the summation voltage at a summation node to a common mode voltage. In this example, a graph of time (i.e., the x-axis) versus summation voltage VX (i.e., the y-axis) is plotted for a single DAC having switched capacitor elements. The x-axis is centered on a common mode voltage in intersecting the y-axis. Reset operations 60 and 62 can be performed after a number of sampling cycles to bring the summation voltage of the DAC back to the common mode voltage. During the reset operation, the summation voltage is brought to the common mode voltage from whatever voltage value it was at. After the reset operation, the summation voltage is back to the next sampled summation voltage after the reset.

If the summation voltage is greater than the common mode voltage before and after the reset, as illustrated near reset operation 60, the summation output voltage waveform will go from that greater value down to the common mode voltage during the reset operation and then back up to the greater summation voltage. Likewise, if the summation voltage is less than the common mode voltage before and after the reset, the summation output voltage waveform will rise from that lower summation voltage to the common mode voltage during the reset operation and then back down to next sampled summation voltage.

Figure 5:
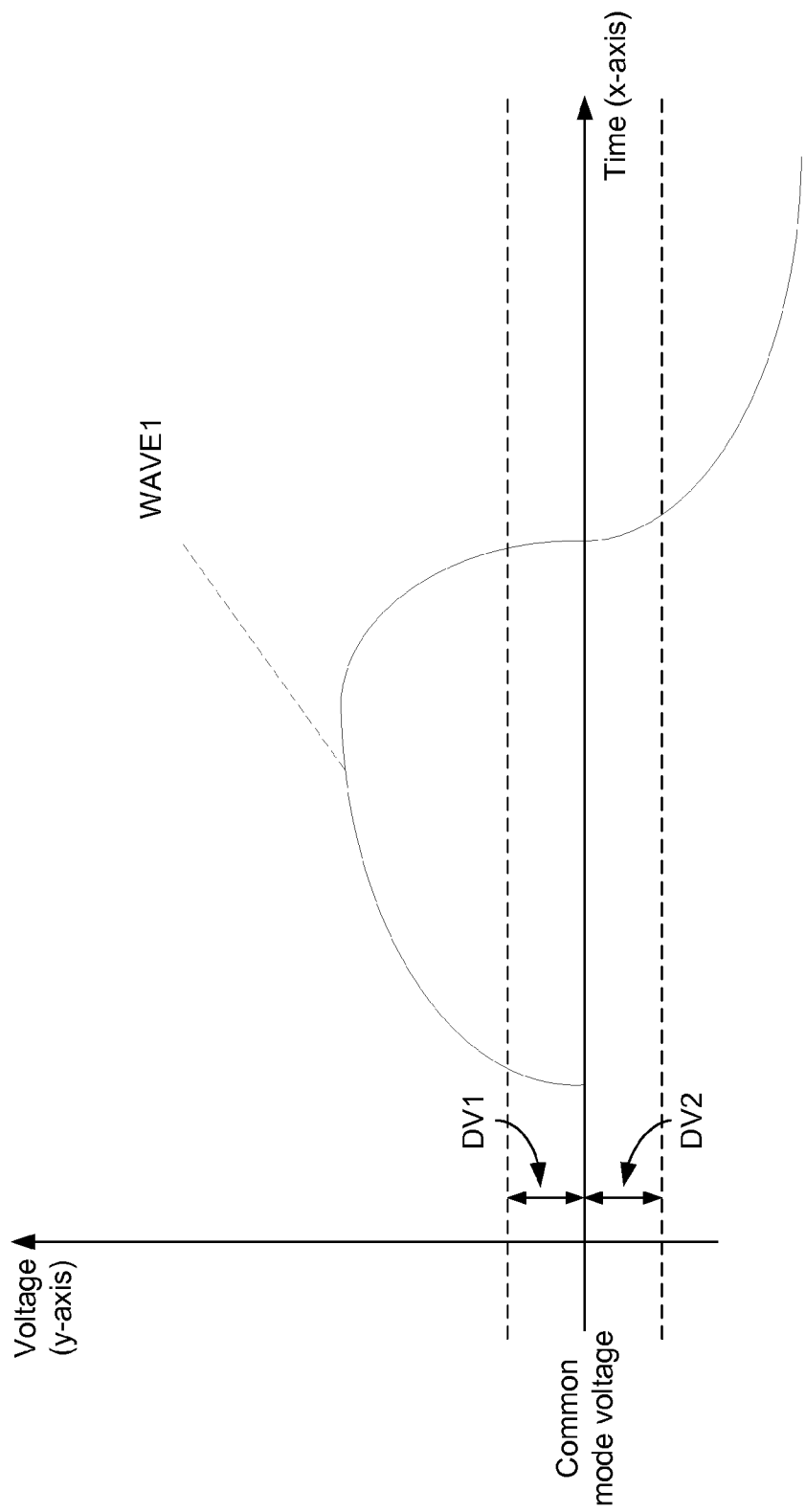
FIG. 5 illustrates an output waveform for a switched capacitor DAC of the present disclosure.

FIG. 5 illustrates an output waveform for a switched capacitor DAC of the present disclosure. The summation output voltage VX can be smoothed out using an ideal filter to generate a smooth analog signal as show in waveform wave1. Furthermore, resetting can be further limited by a DAC of the present disclosure to only be within one or more threshold voltage values. For instance, an upper threshold value DV1 and a lower threshold value DV2 can be used for the threshold values of the summation output voltage. If the waveform wave1 is within this threshold for a predefined amount of time, then the resetting operation can be activated rather than waiting a predefined or random number of sampling cycles.

Figure 6:
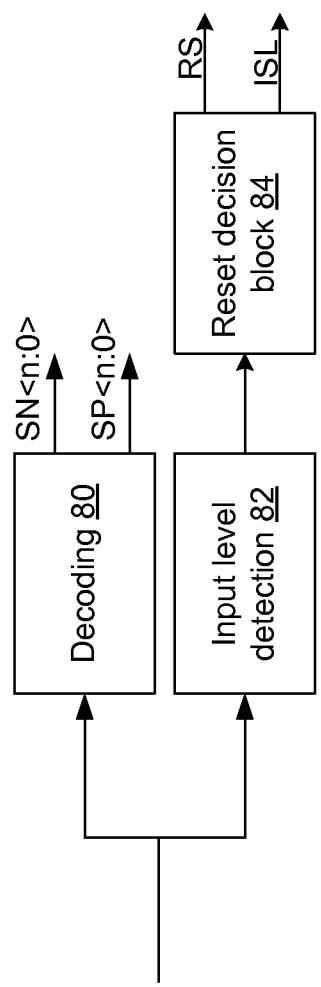
FIG. 6 illustrates a flow diagram for control signals of a switched capacitor DAC of the present disclosure.

FIG. 6 illustrates a flow diagram for control signals of a switched capacitor DAC of the present disclosure. A main control signal can be used to activate the decoding block 80 to decode the digital input code into the control signals SN<n:0> and SP<n:0>. Furthermore, an input level detection 82 can be also activated by the main control signal to monitor the summation voltage output. If the summation voltage output is within the upper threshold value and the lower threshold value, then that information is inputted to a reset decision block 84. The reset decision block 82 can activate the control signal for the reset switch of the respective DAC and the isolation switch of the respective DAC.

The flow diagram can further comprise a cycle counter. The cycle counter can be an independent block (not shown) or combined with the input level detection 82. The RS and ISL signals can be activated after a number of cycles (e.g., when the cycle counter reaches a predefined number of cycles), when the summation voltage reaches the level requirements, or when both requirements are met.

Figure 7:
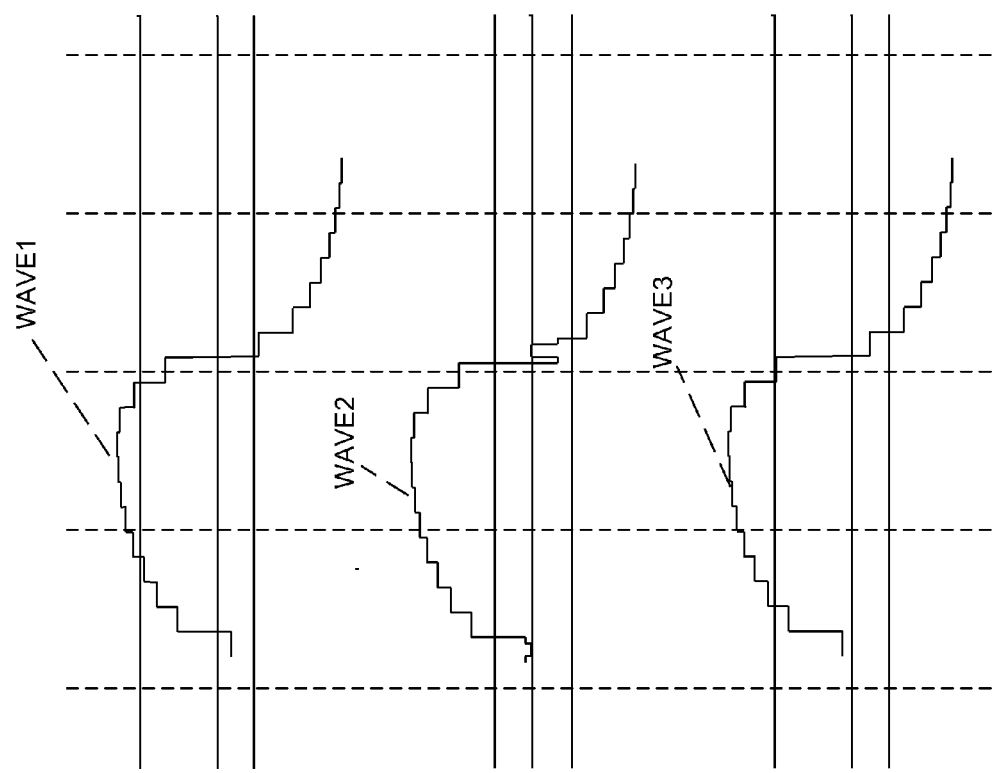
FIG. 7 illustrates waveforms for a switched capacitor DAC of the present disclosure.

FIG. 7 illustrates waveforms for a switched capacitor DAC of the present disclosure. To aid in the understanding of the present disclosure, various waveforms for a DAC of the present invention are shown for illustrative purposes. Wave 1 illustrates an ideal voltage after an ideal filter of the ideal summation voltage of a DAC of the present disclosure. Wave 2 illustrates a waveform of the summation voltage of a DAC of the present disclosure at the summation node 22. Wave 3 illustrates a waveform for the node 18 between the isolation switch and a capacitor of the isolation block.

While the disclosure has been described with reference to certain embodiments, it is to be understood that the disclosure is not limited to such embodiments. Rather, the disclosure should be understood and construed in its broadest meaning, as reflected by the following claims. Thus, these claims are to be understood as incorporating not only the apparatuses, methods, and systems described herein, but all those other and further alterations and modifications as would be apparent to those of ordinary skilled in the art.

We claim:

1. A switched capacitor digital-to-analog converter ("DAC") for converting a digital input code to an analog signal, comprising:
   a switched capacitor array, wherein the digital input code is inputted to the switched capacitor array and wherein the switched capacitor array is connected to a summation node; and
   a reset switch having a first end and a second end,
   wherein the first end is connected to the summation node and the second end is connected to a common mode voltage,
   wherein the reset switch is closed after a predefined number of sampling cycles,
   wherein the predefined number of sampling cycles is greater than one, and
   wherein the analog signal is provided based on a summation voltage at the summation node.

2. The DAC of claim 1 further comprising an isolation block, wherein the isolation block is connected to the summation node when the reset switch is opened.

3. The DAC of claim 2 wherein the isolation block comprises an isolation switch and a capacitor, wherein the isolation switch and the capacitor are connected in series across the summation node and a predefined voltage.

4. The DAC of claim 1 wherein the DAC having a conversion state for actively converting the digital input code to the analog signal and an idle state for the DAC to be idle, and wherein the reset switch is closed during one of the conversion state and the idle state.

5. The DAC of claim 1 wherein the reset switch is periodically closed and then opened.

6. The DAC of claim 1 wherein the predefined number of sampling cycles is randomly changed to a new number after each instance of the reset switch closing.

7. The DAC of claim 1 wherein, when the reset switch is closed, the reset switch is closed for a portion of a sampling cycle.

8. The DAC of claim 1 wherein the reset switch is closed when a summation voltage at the summation node is within a predefined threshold from the common mode voltage.

9. The DAC of claim 8 wherein the reset switch is closed when the summation voltage is within the predefined threshold for a predefined amount of time.

10. A switched capacitor digital-to-analog converter ("DAC") for converting a digital input code to an analog signal, comprising:
    a switched capacitor array, wherein the digital input code is inputted to the switched capacitor array and wherein the switched capacitor array is connected to a summation node;
    a reset switch having a first end and a second end, and
    an isolation block having an isolation switch and a capacitor,
    wherein the first end is connected to the summation node and the second end is connected to a common mode voltage,
    wherein the reset switch is closed when a summation voltage at the summation node is within a predefined threshold from the common mode voltage and a plurality of sampling cycles has passed since a previous reset,
    wherein the analog signal is provided based on a summation voltage at the summation node,
    wherein the isolation block is connected to the summation node when the reset switch is opened, and
    wherein the isolation switch and the capacitor are connected in series across the summation node and a predefined voltage.

11. The DAC of claim 10 wherein the DAC having a conversion state for actively converting the digital input code to the analog signal and an idle state for the DAC to be idle, and wherein the reset switch is closed during one of the conversion state and the idle state.

12. The DAC of claim 10 wherein the reset switch is periodically closed and then opened.

13. The DAC of claim 10 wherein the plurality of sampling cycles is a predefined number of sampling cycles and wherein the predefined number of sampling cycles is randomly changed to a new number after each instance of the reset switch closing.

14. The DAC of claim 10 wherein, when the reset switch is closed, the reset switch is closed for a portion of a sampling cycle.

15. The DAC of claim 10 wherein the reset switch is closed when the summation voltage is within the predefined threshold for a predefined amount of time.

16. A switched capacitor digital-to-analog converter ("DAC") for converting a digital input code to an analog signal, comprising:
    a switched capacitor array, wherein the digital input code is inputted to the switched capacitor array and wherein the switched capacitor array is connected to a summation node;
    a reset switch having a first end and a second end, and an isolation block having an isolation switch and a capacitor, wherein the reset switch is closed after a predefined number of sampling cycles, wherein the predefined number of sampling cycles is greater than one, wherein, when the reset switch is closed, the reset switch is closed for a portion of a sampling cycle, wherein the first end is connected to the summation node and the second end is connected to a common mode voltage, wherein the reset switch is closed when a summation voltage at the summation node is within a predefined threshold from the common mode voltage, wherein the reset switch is closed when the summation voltage is within the predefined threshold for a predefined amount of time, wherein the analog signal is provided based on a summation voltage at the summation node, wherein the isolation block is connected to the summation node when the reset switch is opened, and wherein the isolation switch and the capacitor are connected in series across the summation node and a predefined voltage.

17. The DAC of claim 16 wherein the DAC having a conversion state for actively converting the digital input code to the analog signal and an idle state for the DAC to be idle, and wherein the reset switch is closed during one of the conversion state and the idle state.

18. The DAC of claim 16 wherein the reset switch is periodically closed and then opened.

19. The DAC of claim 16 wherein the predefined number of sampling cycles is randomly changed to a new number after each instance of the reset switch closing.

* * * * *